US008610217B2

(12) United States Patent
Gauthier, Jr. et al.

(10) Patent No.: US 8,610,217 B2
(45) Date of Patent: Dec. 17, 2013

(54) SELF-PROTECTED ELECTROSTATIC DISCHARGE FIELD EFFECT TRANSISTOR (SPESDFET), AN INTEGRATED CIRCUIT INCORPORATING THE SPESDFET AS AN INPUT/OUTPUT (I/O) PAD DRIVER AND ASSOCIATED METHODS OF FORMING THE SPESDFET AND THE INTEGRATED CIRCUIT

(75) Inventors: Robert J. Gauthier, Jr., Hinesburg, VT (US); Mahender Kumar, Fishkill, NY (US); Junjun Li, Williston, VT (US); Dustin K. Slisher, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 12/967,114

(22) Filed: Dec. 14, 2010

(65) Prior Publication Data
US 2012/0146150 A1 Jun. 14, 2012

(51) Int. Cl.
*H01L 23/62* (2006.01)
(52) U.S. Cl.
USPC .................................. 257/360; 257/E27.035
(58) Field of Classification Search
USPC .......................................... 257/360, E27.035
See application file for complete search history.

(56) References Cited

U.S. PATENT DOCUMENTS

| 5,811,857 | A | 9/1998 | Assaderaghi et al. |
| 5,982,003 | A | 11/1999 | Hu et al. |
| 6,034,388 | A | 3/2000 | Brown et al. |
| 6,100,125 | A * | 8/2000 | Hulfachor et al. ............ 438/224 |
| 6,177,324 | B1 | 1/2001 | Song et al. |
| 6,218,704 | B1 | 4/2001 | Brown et al. |
| 6,740,936 | B1 | 5/2004 | Gitlin et al. |
| 6,838,323 | B2 | 1/2005 | Gauthier et al. |
| 6,897,536 | B2 * | 5/2005 | Nomura et al. ............... 257/403 |
| 7,227,730 | B2 | 6/2007 | Litwin et al. |
| 7,250,333 | B2 * | 7/2007 | Dabral et al. ................. 438/238 |
| 2002/0123222 | A1 * | 9/2002 | Wu .............................. 438/682 |
| 2003/0081363 | A1 * | 5/2003 | Kawashima et al. ........... 361/56 |
| 2009/0159973 | A1 * | 6/2009 | Hiraoka et al. ............... 257/360 |
| 2010/0265622 | A1 | 10/2010 | Campi, Jr. et al. |
| 2011/0073950 | A1 * | 3/2011 | Tsutsumi et al. ............. 257/358 |

OTHER PUBLICATIONS

Li et al., "Analysis of Failure Mechanism on Gate-Silicided and Gate-Non-Silicided, Drain/Source Silicide-Blocked ESD NMOSFETs in a 65nm Bulk CMOS Technology," IBM Semiconductor Research and Development Center, Essex Junction, VT 05452, USA.

Mitra et al., "ESD Protection Using Grounded Gatem Gate Non-Silicided (GG-GNS) ESD NFETs in 45nm SOI Technology," pp. 4A.6-1 to 4A.6-5, IBM Microelectronics Research Center and Development Center, Essex Junction, VT 05452.

* cited by examiner

*Primary Examiner* — Daniel Luke
(74) *Attorney, Agent, or Firm* — Gibb & Riley, LLC; Richard M. Kotulak, Esq.

(57) ABSTRACT

Disclosed are embodiments of a self-protected electrostatic discharge field effect transistor (SPESDFET). In the SPESDFET embodiments, a resistance region is positioned laterally between two discrete sections of a deep source/drain region: a first section that is adjacent to the channel region and a second section that is contacted. The second section of the deep source/drain region is silicided, but the first section adjacent to the channel region and the resistance region are non-silicided. Additionally, the gate structure can be either silicided or non-silicided. With such a configuration, the disclosed SPESDFET provides robust ESD protection without consuming additional area and without altering the basic FET design (e.g., without increasing the distance between the deep source/drain regions and the channel region). Also disclosed are embodiments of integrated circuit that incorporates the SPESDFET as an input/output (I/O) pad driver and method embodiments for forming the SPESDFET and the integrated circuit.

10 Claims, 10 Drawing Sheets

SELF-PROTECTED ELECTROSTATIC DISCHARGE FIELD EFFECT TRANSISTOR (SPESDFET), AN INTEGRATED CIRCUIT INCORPORATING THE SPESDFET AS AN INPUT/OUTPUT (I/O) PAD DRIVER AND ASSOCIATED METHODS OF FORMING THE SPESDFET AND THE INTEGRATED CIRCUIT

BACKGROUND

1. Field of the Invention

The present invention relates to electrostatic discharge (ESD) protection of integrated circuits and, more specifically, to a self-protected electrostatic discharge field effect transistor (SPESDFET), to an integrated circuit incorporating the SPESDFET as an input/output (I/O) pad driver and to methods of forming the SPESDFET and the integrated circuit.

2. Description of the Related Art

An electrostatic discharge (ESD) event may cause extremely high currents to flow through the semiconductor devices in an integrated circuit and, thereby cause device junctions, gate oxides, and other adjacent structures to be permanently damaged. As device sizes are decreased and device density is increased with technology scaling, it has become increasingly challenging to achieve adequate protection against such ESD damage. For example, with older technologies, a single silicided N-type field effect transistor (NFET) alone could adequately function as an input/output (I/O) pad driver, providing the necessary protection against ESD discharge. However, with technology scaling, such a single silicided NFET is no longer robust against ESD discharge.

SUMMARY

In view of the foregoing disclosed herein are embodiments of a self-protected electrostatic discharge field effect transistor (SPESDFET). In the SPESDFET embodiments, a resistance region is positioned laterally between two discrete sections of a deep source/drain region: a first section that is adjacent to the channel region and a second section that is contacted. The second section of the deep source/drain region is silicided, but the first section adjacent to the channel region and the resistance region are non-silicided. Additionally, the gate structure can be either silicided or non-silicided. With such a configuration, the disclosed SPESDFET provides robust ESD protection without consuming additional area and without altering the basic FET design (e.g., without increasing the distance between the deep source/drain regions and the channel region). Also disclosed are embodiments of integrated circuit that incorporates the SPESDFET as an input/output (I/O) pad driver and method embodiments for forming the SPESDFET and the integrated circuit.

More particularly, disclosed herein are embodiments of a self-protected electrostatic discharge field effect transistor (SPESDFET). This SPESDFET can comprise a semiconductor layer, having a top surface; an isolation structure in the semiconductor layer at the top surface; and gate structure on the top surface of the semiconductor layer offset from the isolation structure.

The semiconductor layer can comprise a channel region, shallow source/drain extension regions, and deep source drain regions. The channel region can be positioned below the gate structure. The shallow source/drain extension regions can be positioned on opposing sides of the channel region. Specifically, each shallow source/drain extension region can extend vertically from the top surface of the semiconductor layer to a first depth below the top surface and can comprise a first end portion adjacent to the channel region, a second end portion adjacent to the isolation structure and a center portion positioned laterally between the first end portion and the second end portion. The deep source/drain regions can also be positioned on opposing sides of the channel region. Specifically, each deep source/drain region can comprise a first section and a second section. The first section can be positioned adjacent to the channel region and can extend vertically through the first end portion of a corresponding shallow source/drain extension region to a second depth that is below the first depth. The second section can be positioned adjacent to the isolation structure and can extend vertically through the second portion of the corresponding shallow source/drain extension region, also to the second depth.

The SPESDFET can further comprise first and second dielectric layers and a metal silicide layer. The first dielectric layer can be positioned on the top surface of the semiconductor layer abutting the center portion of the shallow source/drain extension region only (i.e., above the resistance region only). The second dielectric layer can be on the top surface of the semiconductor layer abutting and cover the first section of the deep source/drain region. Finally, the metal silicide layer can be positioned on the top surface of the semiconductor layer abutting the second section of the deep source/drain region. However, the first section of the deep source/drain region adjacent to the channel region and the center portion of the shallow source/drain extension region (i.e., the resistance region) are non-silicided due to blocking, during the silicide formation process, by the first and second dielectric layers.

Also disclosed herein are embodiments of an integrated circuit. This integrated circuit can comprise an input/output (I/O) pad and an input/output (I/O) pad driver connected in series between the input/output (I/O) pad and ground. In this case, the input/output (I/O) pad driver can comprise a single N-type SPESDFET configured as described above.

Also disclosed herein are embodiments of a method of forming the above-described SPESDFET. The method embodiments can comprise providing a semiconductor layer. An isolation structure can be formed in the semiconductor layer at the top surface. Then, a gate structure can be formed on the top surface of the semiconductor layer offset from the isolation structure and above a designated channel region.

After the gate structure is formed, shallow source/drain extension regions can be formed on opposing sides of the channel region. Specifically, each shallow source/drain extension region can be formed so as to extend vertically from the top surface of the semiconductor layer to a first depth below the top surface. Then, a first dielectric layer can be formed so as to cover a center portion only of the shallow source/drain extension region. This center portion can be positioned laterally between a first end portion, which is adjacent to the channel region, and a second end portion, which is adjacent to the isolation structure. Next, deep source/drain regions can be formed on opposing sides of the channel region. Specifically, each deep source/drain region can be formed so as to comprise a first section and a second section. The first section can be adjacent to the channel region and can extend vertically through the first end portion of the shallow source/drain extension region to a second depth below the first depth. The second section can be adjacent to the isolation structure and can extend vertically through the second end portion of the shallow source/drain extension region to the second depth. After the deep source/drain regions are formed, a second dielectric layer can be formed so as to cover at least the first section of the deep source/drain region. Then, a metal silicide layer can be formed on the second section. During the process, the first and second dielectric layers block silicide formation on the first section of the deep source/drain region adjacent to the channel region and on the center portion of the shallow source/drain extension region (i.e., on the resistance region).

Also disclosed are embodiments of a method of forming such an integrated circuit. Specifically, the method embodiments can comprise providing a semiconductor layer. An N-type SPESDFET can be formed, in the manner described above, on the semiconductor layer. Then, an input/output (I/O) pad can be formed on the semiconductor layer and the N-type SPESDFET can be electrically connected in-series between the input/output (I/O) pad and ground so that the SPESDFET can function as an input/output (I/IO) pad driver.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, an electrostatic discharge (ESD) event may cause extremely high currents to flow through the semiconductor devices in an integrated circuit and, thereby cause device junctions, gate oxides, and other adjacent structures to be permanently damaged. As device sizes are decreased and device density is increased with technology scaling, it has become increasingly challenging to achieve adequate protection against such ESD damage. For example, with older technologies, a single silicided N-type field effect transistor (NFET) alone could adequately function as an input/output (I/O) pad driver and provide the necessary protection against ESD discharge. However, with technology scaling, such a single silicided NFET is no longer robust against ESD discharge.

Figure 12:
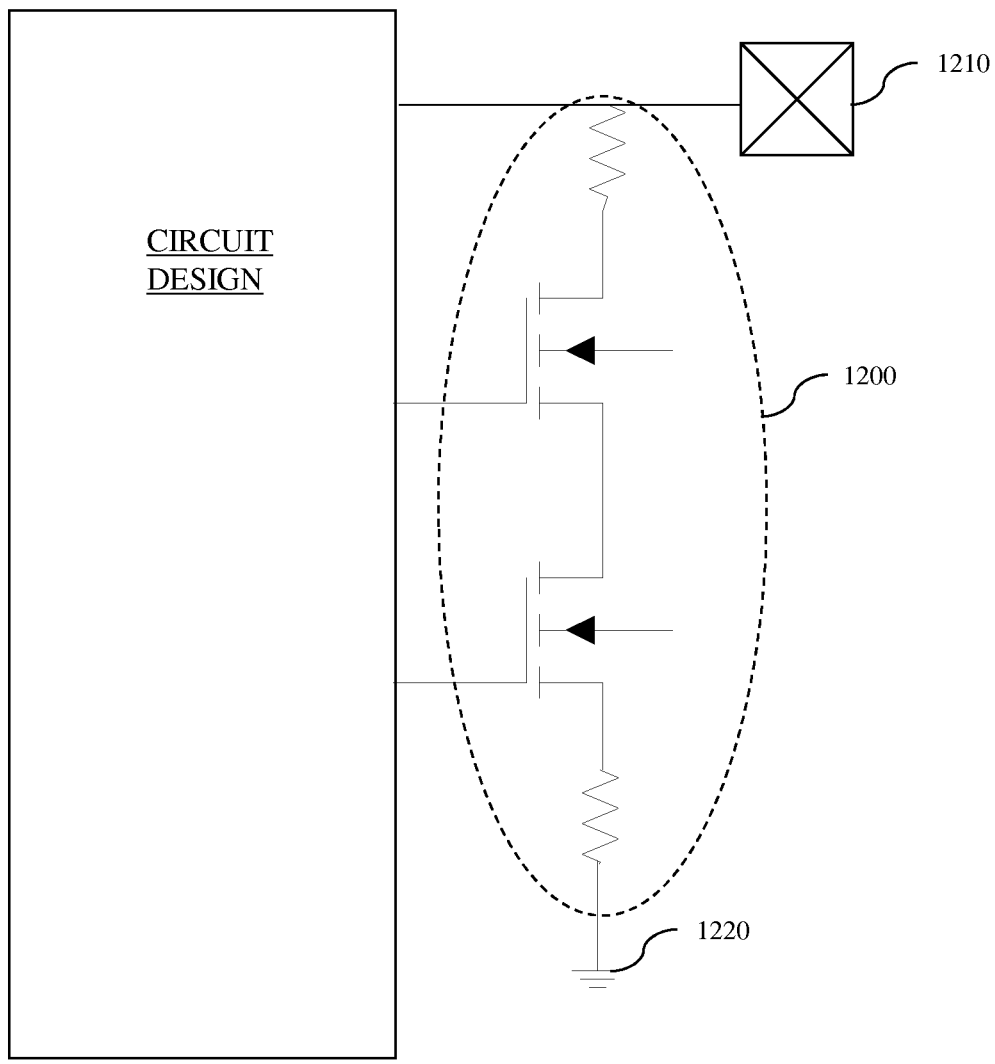
FIG. 12 is a schematic diagram of an integrated circuit incorporating stacked N-type field effect transistors as an input/output (I/O) pad driver.
Figure 13:
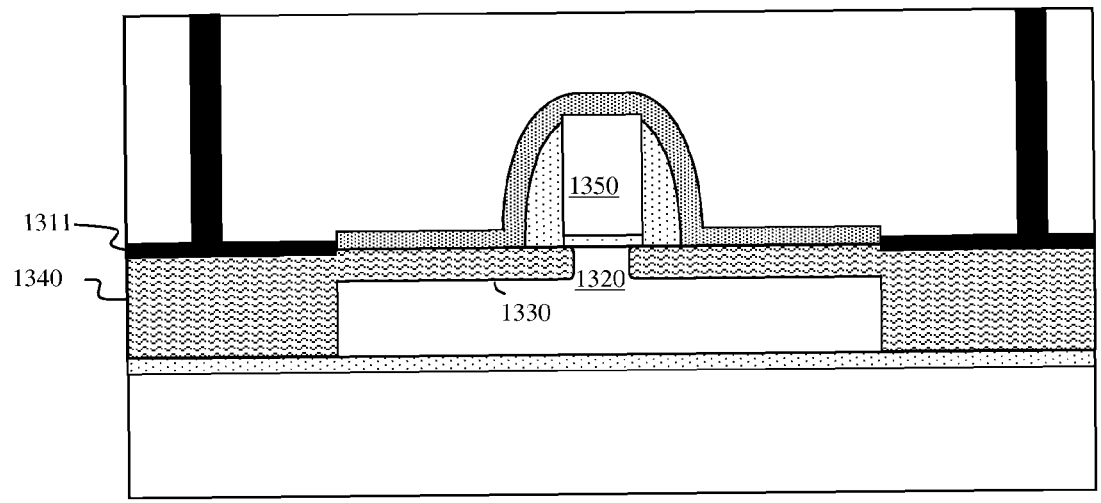
FIG. 13 is a cross-section diagram illustrating a field effect transistor designed for electrostatic discharge protection.
Figure 14:
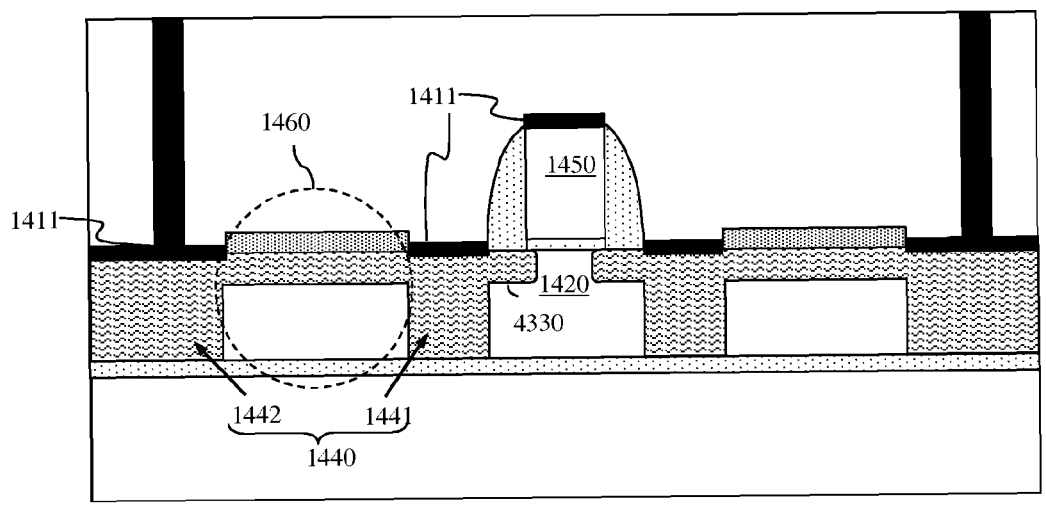
FIG. 14 is a cross-section diagram illustrating another field effect transistor designed for electrostatic discharge protection.

Various solutions have been proposed to solve this ESD protection problem. For example, one proposed solution, as shown in FIG. 12, is to use stacked NFETs 1200 as an I/O pad driver for a circuit (i.e., connected in series between an input/output (I/O) pad 1210 of a circuit and ground 1220). However, this solution consumes a significant amount of chip area. Another proposed solution, as shown in FIG. 13, is to increase the length of the shallow source/drain extension regions 1330 and to block silicide formation on both the gate 1350 and the shallow source/drain extension regions 1330 (i.e., to allow a metal silicide layer 1311 to form only on the deep source/drain regions 1340). However, this solution alters the basic FET design (e.g., by increasing the distance between the FET channel region 1320 and the deep source/drain regions 1340) and, thereby alters FET performance. Yet another proposed solution, as shown in FIG. 14, is to form a resistance region 1460 between two discrete sections of a deep source/drain region 1440 that extend vertically through a shallow source/drain extension region 1430: a first section 1441 that is adjacent to the channel region 1420 and a second section 1442 that is physically separated form the first section and contacted. In this solution, the resistance region 1460 is non-silicided, but the sections 1441-1442 of the deep source/drain region 1440 and also the gate structure 1450 are silicided (i.e., are covered by a metal silicide layer 1411). While this solution doesn't consume a significant amount of chip area or alter the basic FET design, it is also does not provide sufficient ESD discharge protection because of the metal silicide layer 1411 on the section 1441 of the deep source/drain region 1440 adjacent to the channel region 1420.

In view of the foregoing disclosed herein are embodiments of a self-protected electrostatic discharge field effect transistor (SPESDFET). In the SPESDFET embodiments, a resistance region is positioned laterally between two discrete sections of a deep source/drain region: a first section that is adjacent to the channel region and a second section that is contacted. The second section of the deep source/drain region is silicided, but the first section adjacent to the channel region and the resistance region are non-silicided. Additionally, the gate structure can be either silicided or non-silicided. With such a configuration, the disclosed SPESDFET provides robust ESD protection without consuming additional area and without altering the basic FET design (e.g., without increasing the distance between the deep source/drain regions and the channel region). Also disclosed are embodiments of integrated circuit that incorporates the SPESDFET as an input/output (I/O) pad driver and method embodiments for forming the SPESDFET and the integrated circuit.

Figure 1A:
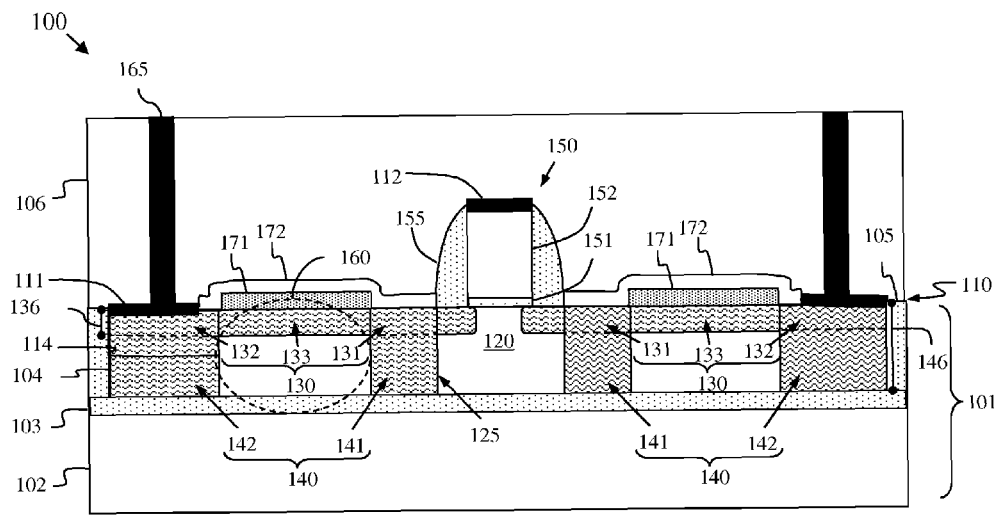
FIG. 1A is a cross-section diagram illustrating an embodiment of a self-protected electrostatic discharge field effect transistor (SPESDFET)
Figure 1B:
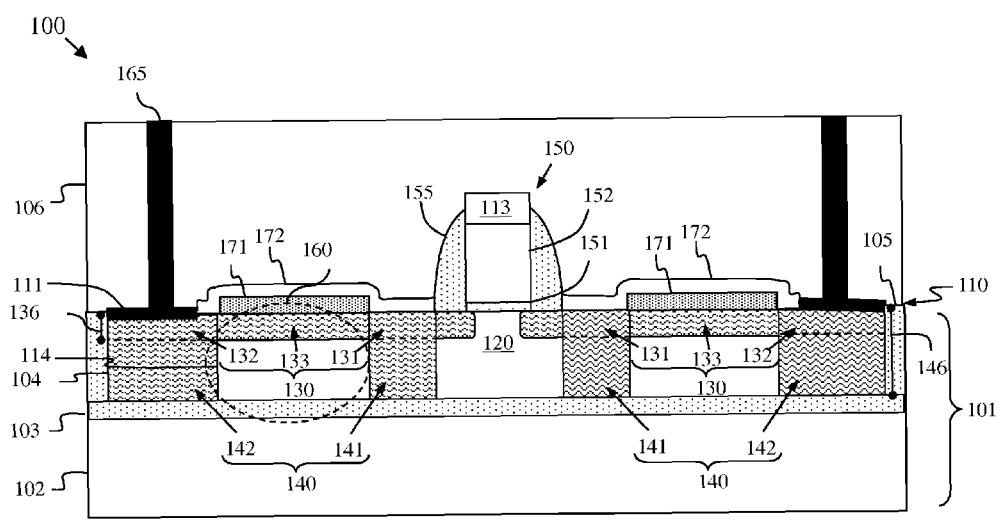
FIG. 1B is a cross-section diagram illustrating another embodiment of a self-protected electrostatic discharge field effect transistor (SPESDFET)

More particularly, FIG. 1A is a cross-section diagram illustrating an embodiment of a self-protected electrostatic discharge field effect transistor (SPESDFET) 100. FIG. 1B is a cross-section diagram illustrating another embodiment of this SPESDFET 100.

It should be understood that the SPESDFET 100, as described below and illustrated in FIGS. 1A-1B, can comprise an N-type field effect transistor (NFET) or a P-type field effect transistor (PFET). Therefore, it should further be understood that, for an NFET, the "first conductivity type" refers to P-type conductivity and the "second conductivity type" refers to N-type conductivity. However, for a PFET, the reverse is true. That is, for a PFET, the first conductivity type refers to N-type conductivity and the second conductivity type refers to P-type conductivity. Additionally, those skilled in the art will recognize that P-type conductivity is typically achieved in a semiconductor material by doping with a P-type dopant (e.g., a Group III dopant, such as boron (B) or indium (In)), whereas N-type conductivity is typically achieved in a semiconductor material by doping with an N-type dopant (e.g., a Group V dopant, such as arsenic (As), phosphorous (P) or antimony (Sb)).

In each of these embodiments, the SPESDFET 100 can comprise a semiconductor layer 104. For example, this semiconductor layer 104 can comprise a semiconductor layer of a semiconductor-on-insulator (SOI) wafer 101. Specifically, the SOI wafer 101 can comprise a semiconductor substrate 102 (e.g., a single crystalline silicon substrate or other suitable semiconductor layer). The SOI wafer 101 can further comprise an insulator layer 103 (e.g., a silicon dioxide (SiO2) layer or other suitable insulator layer) on the semiconductor substrate 102 and a semiconductor layer 104 (e.g., a single crystalline silicon layer or other suitable semiconductor layer) on the insulator layer 103. Alternatively, the semiconductor layer 104 can comprise a bulk semiconductor wafer, such as a bulk silicon wafer (not shown).

The semiconductor layer 104 can have a first conductivity type. For example, in an NFET, it can be doped with a relatively low concentration of a P-type dopant (i.e., it can comprise a P− semiconductor layer). Those skilled in the art will recognize that, if a bulk semiconductor wafer is used rather than an SOI wafer, such an NFET would be formed within a P− well region of the wafer.

A trench isolation structure 105 can define the active region for the SPESDFET 100 and can electrically isolate the SPESDFET 100 from other devices on the substrate 101. This trench isolation structure can, optionally, extend vertically through the semiconductor layer 104 to the insulator layer 103 and can comprise, for example, a conventional shallow trench isolation (STI) structure comprising a trench filled with one or more isolation materials (e.g., a silicon oxide, silicon nitride, silicon oxynitride, etc.).

A gate structure 150 can be positioned on the top surface 110 of the semiconductor layer 104 offset from the isolation structure 105 and traversing a designated channel region 120 within the active region. This gate structure 150 can comprise a gate dielectric layer 151 on the top surface 110 of the semiconductor layer 104 and a gate conductor layer 152 on the gate dielectric layer 151. The gate dielectric layer 151 can comprise, for example, a silicon dioxide (SiO$_2$) gate dielectric layer, a high-k gate dielectric layer or any other suitable gate dielectric layer. The gate conductor layer 152 can comprise, for example, a polysilicon gate conductor layer doped with a second conductivity type dopant such that it has the second conductivity type. For example, in an NFET, the polysilicon gate conductor layer can be doped with an N-type dopant. For a PFET, the polysilicon gate conductor layer can be doped with a P-type dopant. Alternatively, the gate conductor layer can comprise a metal gate conductor layer having the appropriate work function (i.e., energy band). In one embodiment of the SPESDFET 100, as shown in FIG. 1A, the gate structure 150 can further comprise a metal silicide layer 112 above a polysilicon gate conductor layer 152. This metal silicide layer 112 can comprise, for example, a silicide of a refractory or noble metal (e.g., nickel, cobalt, tungsten, chromium, platinum, titanium, molybdenum, palladium, etc.) or an alloy thereof. Alternatively, in another embodiment of the SPESDFET 100, as shown in FIG. 1B, the gate structure 150 can further comprise a dielectric cap layer 113 (e.g., a silicon nitride (SiN) cap layer) above the gate conductor layer 152. Gate sidewall spacers 155 (e.g., silicon dioxide (SiO$_2$) spacers, silicon nitride (SiN) spacers, or any other suitable dielectric gate sidewall spacers) can be positioned on the top surface of the semiconductor layer 104 on opposing sides of the gate structure 150.

The SPESDFET 100 can further comprise a channel region 120, having the first conductivity type, within the semiconductor layer 104 at the top surface 110 and aligned below the gate structure 150. For example, in an NFET, the channel region 120 can comprise a P-channel region.

The SPESDFET 100 can further comprise shallow source/drain extension regions 130 within the semiconductor layer 104 and positioned on opposing sides of the channel region 120. Each shallow source/drain extension region 130 can extend vertically from the top surface 110 of the semiconductor layer 104 to a first depth 136 below the top surface 110 and can comprise a first end portion 131 adjacent to the channel region 120, a second end portion 132 adjacent to the isolation structure 105 and a center portion 133 positioned laterally between the first end portion 131 and the second end portion 132. As mentioned above, gate sidewall spacers 155 can be positioned on the top surface of the semiconductor layer 104 on opposing sides of the gate structure 150 and, thereby above the first portions 131 of the source/drain extension regions 130. The shallow source/drain extension regions 130 can have a second conductivity type different from the first conductivity type and can be doped with a relatively low concentration of a second conductivity type dopant. For example, in an NFET, the shallow source/drain extension regions 130 can be N− or N shallow dopant implant regions.

The SPESDFET 100 can further comprise deep source/drain regions 140 within the semiconductor layer 104 also positioned on opposing sides of the channel region 120. Each deep source/drain region 140 can comprise a first section 141 and a second section 142. The first section 141 can be positioned adjacent to the channel region 120 and can extend vertically through the first end portion 131 of a corresponding shallow source/drain extension region 130 to a second depth 146 that is below the first depth 136. The interface 125 between the first section 141 of the deep source/drain region 140 and the channel region 120 can be aligned below the outer edge of a gate sidewall spacer 155 on the same side of the gate structure 150. The second section 142 can be positioned adjacent to the isolation structure 105 and can extend vertically through the second portion 132 of the corresponding shallow source/drain extension region 130, also to the second depth 146. Each of the sections 141-142 of the deep source/drain regions 140 can have the second conductivity type and can be doped with a relatively high concentration of the second conductivity type dopant. For example, in an NFET, each of the sections 141-142 of the deep source/drain regions 140 can be N+ deep dopant implant regions. Thus, within each second conductivity type deep source/drain region 140, the first and second sections 141-142 are separated by a resistance region 160 that comprises the center portion 133 of the second conductivity type shallow source/drain extension region 130 as well as a portion 114 of the first conductivity type semiconductor layer 104 below.

Optionally, the SPESDFET 100 can further comprise halo regions (not shown) within the semiconductor layer 104 on opposing sides of the channel region 120 for reducing short channel effects. Such halo regions can be positioned between the deep source/drain regions 140 and the channel region 120 and/or the shallow source/drain extension regions 130 and the channel region 120. These halo regions can have the same conductivity type as the channel region (i.e., a first conductivity type) but can be doped with a higher concentration of first conductivity type dopant. For example, in an NFET, the channel region can comprise a P-channel region and each halo region can comprise a P+ dopant implant region.

The SPESDFET 100 can further comprise first and second dielectric layers 171-172 and a metal silicide layer 111 on the top surface 110 of the semiconductor layer 104 on each side of the gate structure 150. Specifically, on each side of the gate structure 150, a first dielectric layer 171 (e.g., a silicon nitride (SiN) layer or other suitable dielectric silicide blocking layer) can be positioned above and abutting (i.e., in direct physical contact with) the center portion 133 of the shallow source/drain extension region 130 only (i.e., above the resistance region 160 only). Additionally, a second dielectric layer 172 (e.g., another silicon nitride (SiN) layer or other suitable dielectric silicide blocking layer) can be positioned above and abutting (i.e., in direct physical contact with) the first section 141 of the deep source/drain region 140 such that the first section 141 is covered by the second dielectric layer 172. Thus, the second dielectric layer 172 is further positioned laterally adjacent to and abutting the outer edge of the gate sidewall spacer 155 on the same side of the gate structure 150. The second dielectric layer 172 can further extend laterally over the first dielectric layer 171 and, optionally, onto a portion of the second section 142 of the deep source/drain region 140. The metal silicide layer 111 can be positioned above and abutting the second section 142 of the deep source/drain region 140. Like the metal silicide layer 112 above the gate conductor layer 152 in the embodiment shown in FIG. 1A, this metal silicide layer 111 can comprise, for example, a silicide of a refractory or noble metal (e.g., nickel, cobalt, tungsten, chromium, platinum, titanium, molybdenum, palladium, etc.) or an alloy thereof. It should be noted that, if the second dielectric layer 172 extends onto a portion of second section 142 of the deep source/drain region 140, then this metal silicide layer 111 will be positioned laterally immediately adjacent to the second dielectric layer 172 and only partially cover the second section 142. Thus, in the SPESDFET 100, the first section 142 of the deep source/drain region 140 immediately adjacent to the channel region 120 and the center portion 133 of the shallow source/drain extension region 130 (i.e., the resistance region 160) are non-silicided due to blocking, during the silicide formation process, by the first and second dielectric layers 171-172. However, at least a portion of the second section 142 of the deep source/drain region 140 and, optionally, the gate structure 150 (as shown in the embodiment shown in FIG. 1A) are silicided.

In addition to the features described above, the SPESDFET 100 can further comprise one or more additional blanket dielectric layers 106 (i.e., interlayer dielectrics) over the structure, as described above. For example, the additional dielectric layer(s) can cover the gate structure 150 as well as the metal silicide layer 111 and the second dielectric layer 172 on each side of the gate structure 150. Contacts 165 (i.e., conductor filled vias) can extend vertically through the additional dielectric layer(s) 106 landing on the metal silicide layer 111 above each second section 142 of each source/drain regions and also to the gate structure 150 (not shown).

Figure 2:
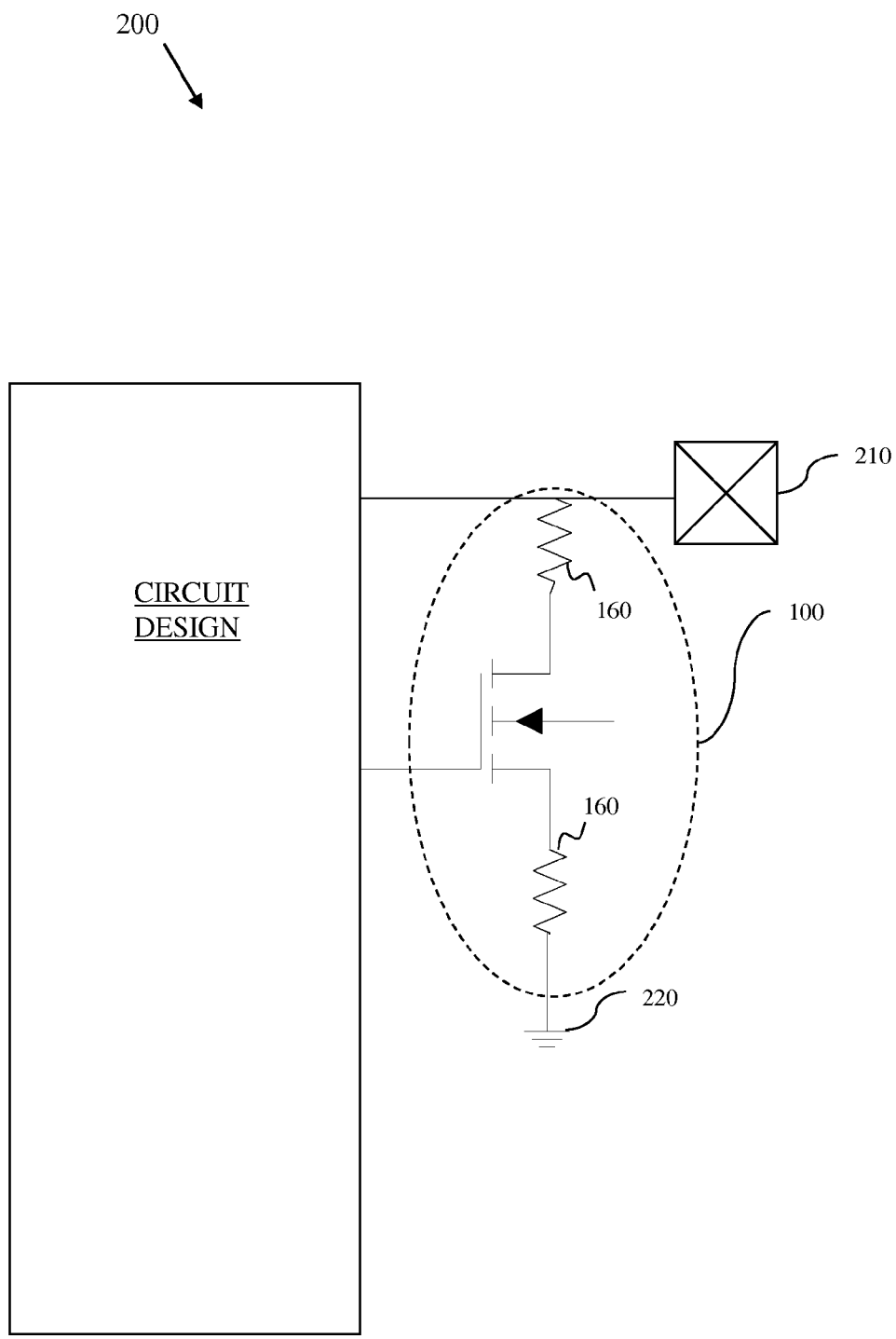
FIG. 2 is a schematic diagram of an integrated circuit incorporating the self-protected electrostatic discharge field effect transistor (SPESDFET) of FIG. 1A or FIG. 1B as an input/output (I/O) pad driver.

Referring to FIG. 2 also disclosed herein are embodiments of an integrated circuit 200 that incorporates the above-described SPESDFET 100, as shown in Figures 1A or 1B. This integrated circuit 200 can comprise an input/output (I/O) pad 210, ground 220 and an input/output (I/O) pad driver connected in series between the input/output (I/O) pad 210 and ground 220. That is, the source/drain contacts 165 (i.e., the resistors, as illustrated) can be arranged between the SPESDFET 100 and the I/O pad 210 and between the SPESDFET 100 and ground 220, respectively. In this case, the input/output (I/O) pad driver can comprise a single N-type SPESDFET 100 configured as described above. The gate structure 150 can be tied to an internal driver circuit output of the integrated circuit. Since the FET 100 is self-protected (i.e., robust against ESD damage), additional structures are not required for ESD protection.

Figure 3:
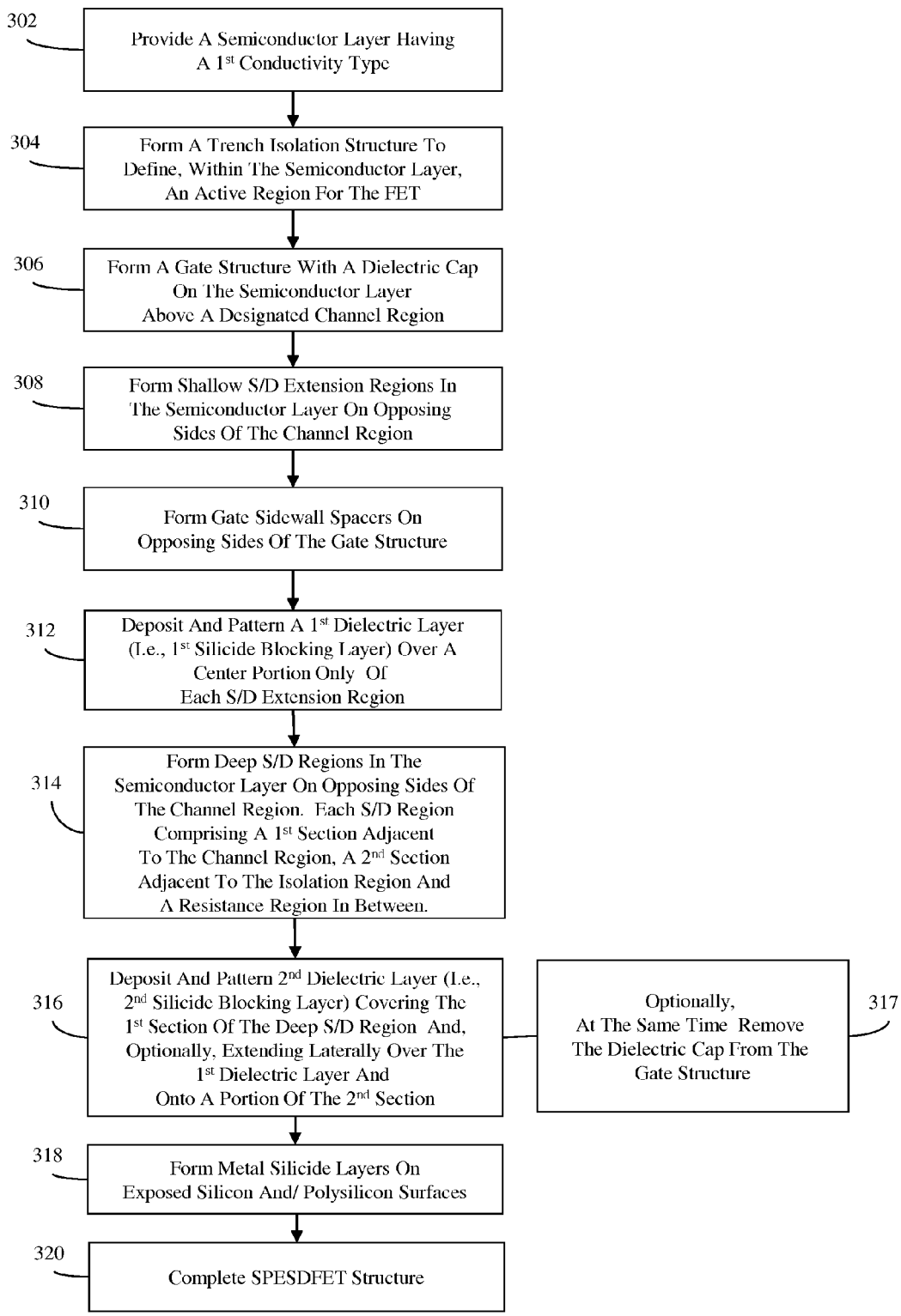
FIG. 3 is a flow diagram illustrating method embodiments for forming the self-protected electrostatic discharge field effect transistor (SPESDFET) of FIGS. 1A and 1B.

Referring to FIG. 3, also disclosed herein are embodiments of a method of forming the above-described SPESDFET 100, as shown in FIGS. 1A and 1B.

It should be understood that the method embodiments, as described below, can be used to form an N-type field effect transistor (NFET) or a P-type field effect transistor (PFET). Therefore, it should further be understood that, for an NFET, the "first conductivity type" refers to P-type conductivity and the "second conductivity type" refers to N-type conductivity. However, for a PFET, the reverse is true. That is, for a PFET, the first conductivity type refers to N-type conductivity and the second conductivity type refers to P-type conductivity. Additionally, those skilled in the art will recognize that P-type conductivity is typically achieved in a semiconductor material by doping with a P-type dopant (e.g., a Group III dopant, such as boron (B) or indium (In)), whereas N-type conductivity is typically achieved in a semiconductor material by doping with an N-type dopant (e.g., a Group V dopant, such as arsenic (As), phosphorous (P) or antimony (Sb)).

The method embodiments can comprise providing a semiconductor layer 104. The provided semiconductor layer 104 can comprise a semiconductor layer of a semiconductor-on-insulator (SOI) wafer 101 (302, see FIG. 4). Specifically, this SOI wafer 101 can comprise a semiconductor substrate 102 (e.g., a single crystalline silicon substrate or other suitable semiconductor layer). The SOI wafer 101 can further comprise an insulator layer 103 (e.g., a silicon dioxide (SiO2) layer or other suitable insulator layer) on the semiconductor substrate 102 and a semiconductor layer 104 (e.g., a single crystalline silicon layer or other suitable semiconductor layer) on the insulator layer 103. The semiconductor layer 104 can be doped with a relatively low concentration of a first conductivity type and the SPESDFET 100 can be formed, as described below, within this first conductivity type semiconductor layer 104. For example, an N-type SPESDFET 100 can be formed in a semiconductor layer 104 doped with a relatively low concentration of a P-type dopant (i.e., a P− or P semiconductor layer).

Alternatively, the provided semiconductor layer 104 can comprise a bulk semiconductor wafer, such as a bulk silicon wafer (not shown). This bulk semiconductor wafer can further comprise a well region doped with a relatively low concentration of the first conductivity type and the SPESDFET 100 can be formed, as described below, within this first conductivity type well region. For example, an N-type SPESDFET 100 can be formed within well region doped with a relatively low concentration of a P-type dopant (i.e., a P well region or P− well region).

Figure 4:
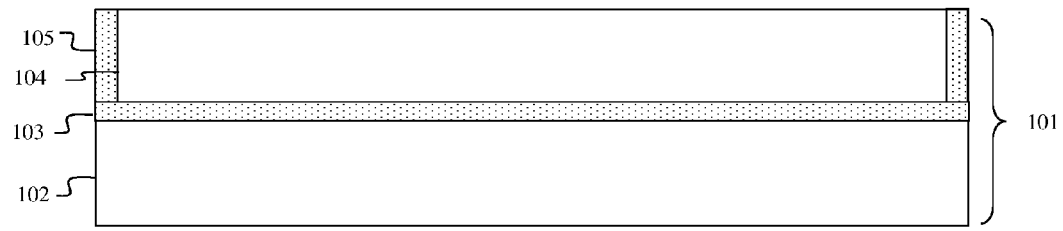
FIG. 4 is a cross-section diagram illustrating a partially completed self-protected electrostatic discharge field effect transistor (SPESDFET) formed according to the method of FIG. 3.

A trench isolation structure 105 can be formed in the semiconductor layer 104 so as to define the active region for the SPESDFET 100 and so as to electrically isolate the SPESDFET 100 from other devices on the substrate 101 (304, see FIG. 4). The trench isolation structure 105 can be formed, for example, using conventional shallow trench isolation (STI) formation techniques. That is, a trench can be formed (e.g., using lithographic patterning and etch techniques) around the active region. The trench can, optionally, be etched such that it extends vertically completely through the semiconductor layer 104 to the insulator layer 103 below. The trench can then be filled with one or more isolation materials (e.g., a silicon oxide, silicon nitride, silicon oxynitride, etc.). Next, a chemical mechanical polishing (CMP) process can be performed to remove any excess isolation material from the top surface 110 of the semiconductor layer 104.

Figure 5:
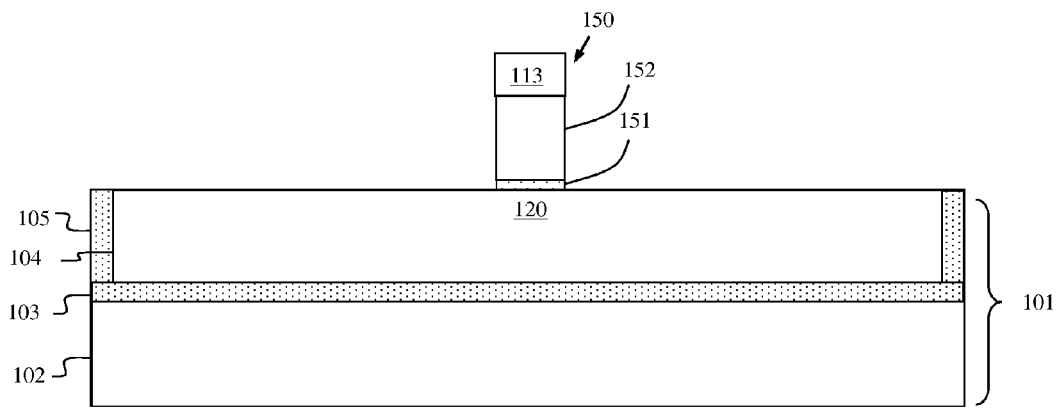
FIG. 5 is a cross-section diagram illustrating a partially completed self-protected electrostatic discharge field effect transistor (SPESDFET) formed according to the method of FIG. 3.

Then, a gate structure 150 can be formed on the top surface 110 of the semiconductor layer 104 offset from the isolation structure 105 and above a designated channel region 120 (306, see FIG. 5). Specifically, a gate dielectric layer 151 (e.g., a silicon dioxide ($SiO_2$) gate dielectric layer, a high-k gate dielectric layer or any other suitable gate dielectric layer) can be formed (e.g., deposited) on the top surface 110 of the semiconductor layer 104. Then, a gate conductor layer 152 (e.g., a polysilicon gate conductor layer) can be formed (e.g., deposited) on the gate dielectric layer 151. A polysilicon gate conductor layer 152 can be in-situ doped a second conductivity type dopant such that it has the second conductivity type or subsequently implanted (e.g., during formation of the source/drain regions, as described in detail below). For example, for a NFET, the polysilicon gate conductor layer can be doped with an N-type dopant. For a PFET, the polysilicon gate conductor layer can be doped with a P-type dopant. A dielectric cap layer 113 (e.g., a silicon nitride (SiN) cap layer) can be formed (e.g., deposited) on top of the gate conductor layer 152. Once this gate stack is formed, it can be lithographically patterned and etch so as to form the gate structure 150 aligned above the designated channel region 120 and traversing the width of the active region.

The above-described technique for forming the gate structure 150 is offered for illustration purposes only and is not intended to be limiting. Techniques for forming gate structures with different configurations (e.g., gate structures with a metal gate conductor layer having a specific work function, with multiple metal and/or polysilicon gate conductor layers having dual work functions, etc.) are well-known in the art and can, alternatively, be incorporated into the method embodiments disclosed.

Figure 6:
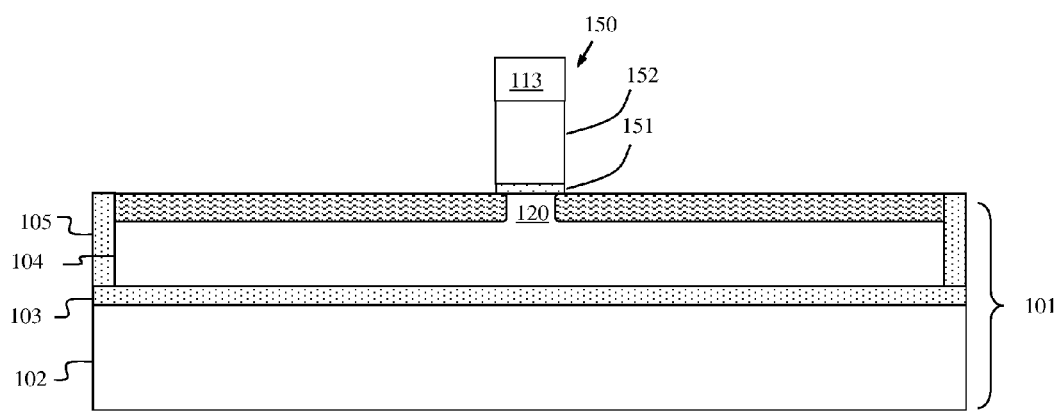
FIG. 6 is a cross-section diagram illustrating a partially completed self-protected electrostatic discharge field effect transistor (SPESDFET) formed according to the method of FIG. 3.

After the gate structure 150 is formed at process 306, shallow source/drain extension regions 130 can be formed on opposing sides of the channel region 120 (308, see FIG. 6). For example, dopant ions, having a second conductivity type that is different from the first conductivity type, can be implanted (e.g., using conventional ion implantation techniques) into the exposed surface of the semiconductor layer 104. The implant dose used during this process 308 can be such that the resulting source/drain extension regions 130 have a relatively low concentration of the second conductivity type dopant. For example, for an NFET, an N-type dopant can be implanted into the exposed surface of the semiconductor layer 104 to form N− or N source/drain extension regions. The implant energy used during this process 308 can be such that the resulting source/drain extension regions 130 are relatively shallow (i.e., such that they extend vertically from the top surface 110 of the semiconductor layer 104 to a first depth 136 below the top surface 110, but above and physically separated from the insulator layer 103). Each shallow source/drain region 130, as formed, will have a first end portion 131 adjacent to the channel region 120, a second end portion 132 adjacent to the isolation region and a center portion 133 positioned laterally between the first and second end portions 131-132.

Figure 7:
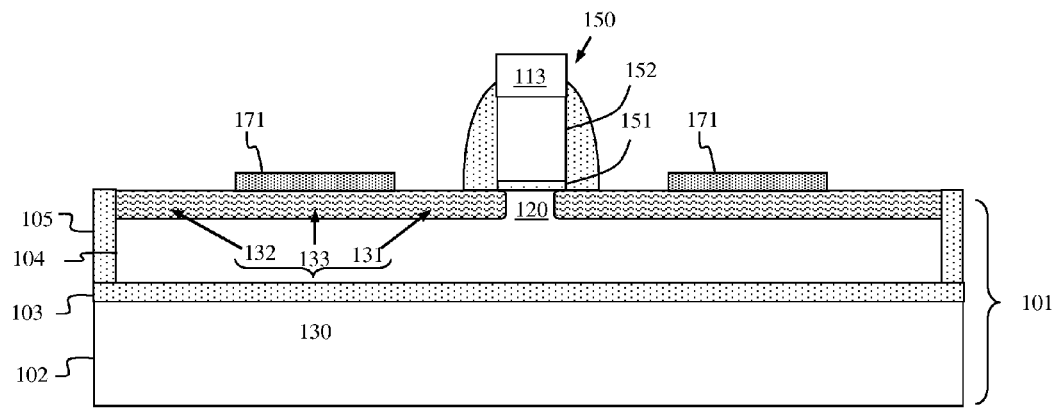
FIG. 7 is a cross-section diagram illustrating a partially completed self-protected electrostatic discharge field effect transistor (SPESDFET) formed according to the method of FIG. 3.

After the shallow source/drain extension regions 130 are formed at process 308, gate sidewall spacers 155 can be formed on opposing sides of the gate structure 150 (310, see FIG. 7). For example, a conformal silicon dioxide ($SiO_2$) layer, a conformal silicon nitride (SiN) layer, or other suitable conformal dielectric layer can be formed on the gate structure 150. Then, a directional etch process can be performed so as to form the spacers (e.g., silicon dioxide ($SiO_2$) spacers, silicon nitride (SiN) spacers, etc.). Thus, each gate sidewall spacer 155, as formed will be positioned on the top surface 110 of the semiconductor layer 104 above the first end portion 131 of the source/drain region.

Next, a first dielectric layer 171 (i.e., a first silicide blocking layer) can be formed on the center portion 133 only of each of source/drain extension region 130 (312, see FIG. 7). For example, a first dielectric layer 171, such as a silicon nitride (SiN) layer, can be deposited. This first dielectric layer 171 can then be lithographically patterned and etched so as to expose the gate structure 150, the isolation structure 105, and the end portions 131-132 of the source/drain extension regions 130. The lithographic patterning and etch processes can specifically be performed so that, on each side of the gate structure, the remaining first dielectric layer 171 covers only the center portion 133 of the shallow source/drain extension region 130 and does not extend laterally over the first end portion 131 to the gate sidewall spacer 155 or over the second end portion 132 to the isolation structure 105.

Figure 8:
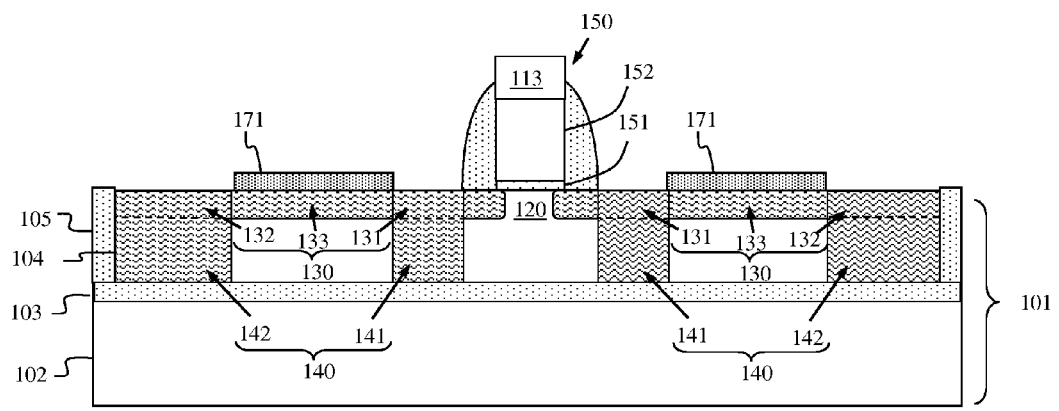
FIG. 8 is a cross-section diagram illustrating a partially completed self-protected electrostatic discharge field effect transistor (SPESDFET) formed according to the method of FIG. 3.

Then, deep source/drain regions 140 can be formed on opposing sides of the channel region 120 (314, see FIG. 8). For example, dopant ions, having the second conductivity type, can be implanted (e.g., using conventional ion implantation techniques) into the exposed surface of the semiconductor layer 104. During this dopant ion implantation process 314, the gate structure 150, the gate sidewall spacers 155 and the first dielectric layer 171 can function as masks. As a result, each source/drain region 140 can comprise a first section 141 and a second section 142. The first section 141 can be adjacent to the channel region 120 and the interface between the first section 141 and the channel region 120 can be aligned below the outer edge of the sidewall spacer 155. The second section 142 can be adjacent to the isolation structure 105 and can be physically separated from the first section 141 by a distance approximately equal to the length of the first dielectric layer 171. The implant dose used during this process 314 can be such that the resulting sections 141-142 of the source/drain regions 140 have a relatively high concentration of the second conductivity type dopant (i.e., a higher concentration than in the source/drain extension regions 130). For example, for an NFET, an N-type dopant can be implanted into the exposed surface of the semiconductor layer 104 to form N+ sections 141-142 for the source/drain regions 140. Additionally, the implant energy used during this process 314 can be such that the resulting sections 141-142 of the source/drain regions 140 are relatively deep (i.e., such that they extend vertically from the top surface 110 of the semiconductor layer 104 to a second depth 146 below first depth 136 and, optionally, down to the insulator layer 103). As a result, a resistance region 160 is created between the first and second sections 141-142 of each deep source/drain region 140.

Figure 9A:
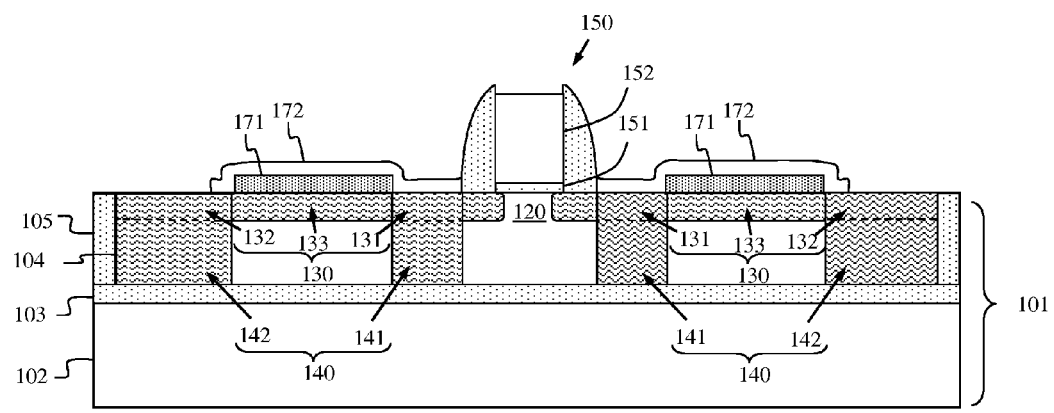
FIG. 9A is a cross-section diagram illustrating a partially completed self-protected electrostatic discharge field effect transistor (SPESDFET) formed according to the method of FIG. 3.
Figure 9B:
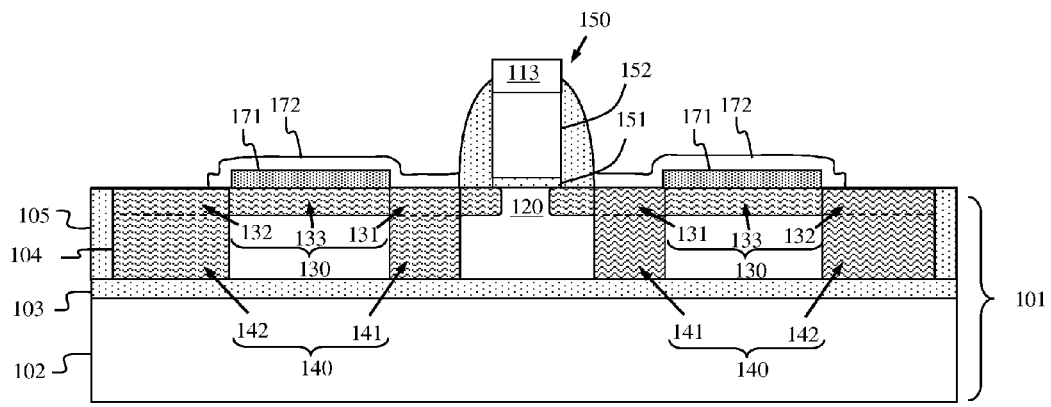
FIG. 9B is a cross-section diagram illustrating an alternative partially completed self-protected electrostatic discharge field effect transistor (SPESDFET) formed according to the method of FIG. 3.

After the deep source/drain regions 140 are formed at process 314, a second dielectric layer 172 (i.e., a second silicide blocking layer) can be formed so as to cover at least the first section 141 of each of the deep source/drain regions 140 (316, see FIGS. 9A and 9B). For example, a second dielectric layer 172, such as another silicon nitride (SiN) layer, can be deposited. This second dielectric layer 172 can then be lithographically patterned and etched so as to expose, on each side of the gate structure 150, at least a portion of the second section 142 of the deep source/drain region 140. The lithographic patterning and etch processes can specifically be performed so that, on each side of the gate structure 150, the remaining second dielectric layer 172 covers the entire first section 141 of the source/drain region 140 and, thus, is positioned laterally adjacent to and abuts the outer edge of the gate sidewall spacer 155. Optionally, these lithographic patterning and etch processes can be performed so that, on each side of the gate structure 150, the remaining second dielectric layer 172 extends laterally over the first dielectric layer 171. Optionally, these lithographic patterning and etch processes can be performed so that, on each side of the gate structure 150, the remaining second dielectric layer 172 further extends laterally onto a portion of the second section 142 of the deep source/drain region 140 (as shown in FIGS. 9A and 9B). Optionally, these lithographic patterning and etch processes can be performed so as to expose and remove the nitride cap layer 113 from the top surface of the gate structure 150 (as shown in FIG. 9A). Alternatively, these lithographic patterning and etch processes can be performed so that the nitride cap layer 113 at the top surface of the gate structure 150 remains intact (as shown in FIG. 9B).

Figure 10A:
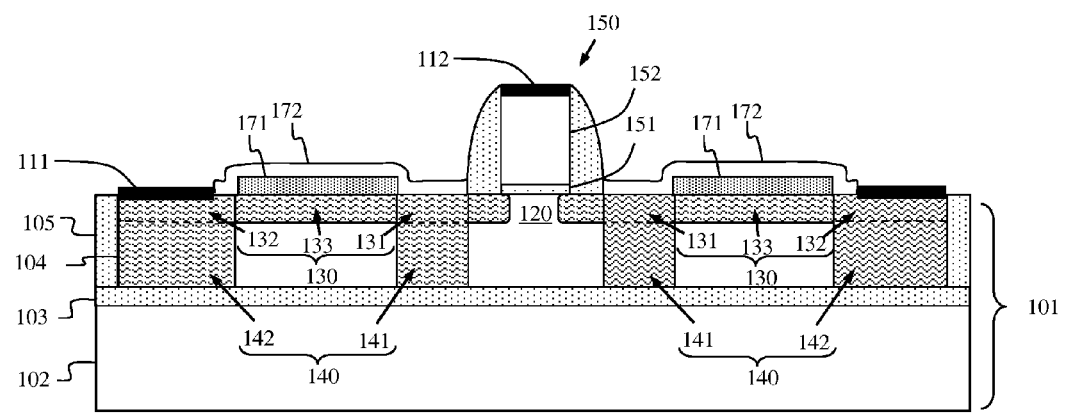
FIG. 10A is a cross-section diagram illustrating a partially completed self-protected electrostatic discharge field effect transistor (SPESDFET) formed according to the method of FIG. 3.
Figure 10B:
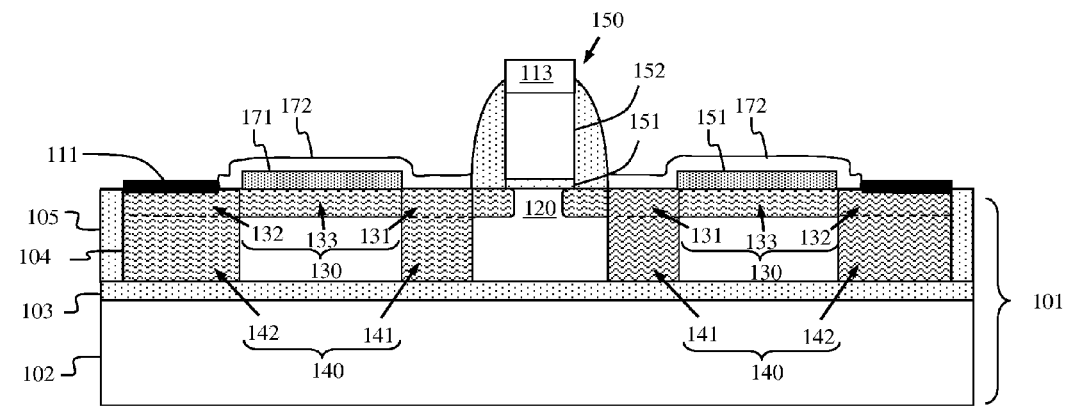
FIG. 10B is a cross-section diagram illustrating an alternative partially completed self-protected electrostatic discharge field effect transistor (SPESDFET) formed according to the method of FIG. 3.

Once the second dielectric layer 172 is formed at process 316, a metal silicide layer 111 can be formed on the second section 142 of each deep source/drain region 140 (318, see FIGS. 10A and 10B). Specifically, a blanket metal layer (e.g., a layer of a refractory or noble metal, such as nickel, cobalt, tungsten, chromium, platinum, titanium, molybdenum, palladium, etc., or an alloy thereof) can be deposited (e.g., by sputtering). Then, an anneal process (e.g., a thermal anneal process) can be performed in order to cause metal atoms from the metal layer to react with silicon at any metal-silicon interface. During this silicidation process, the first and second dielectric layers 171-172 block silicide formation on the first section 141 of the deep source/drain region 140 adjacent to the channel region 120 and on the center portion 133 of the shallow source/drain extension region 130 (i.e., on the resistance region 160). As mentioned above, optionally, the second dielectric layer 172 can be formed so that it extends laterally onto a portion of the second section 142 of the deep source/drain region 140. In this case, the metal silicide layer 111, as formed, will only partially cover the second section 142 of the deep source/drain region and will be positioned laterally immediately adjacent to the second dielectric layer 172.

It should be noted that, if the nitride cap layer 113 is removed from the gate structure 150 at process 316, as shown in FIG. 9A, and if the gate conductor layer 152 comprises a polysilicon gate conductor layer, then an additional metal silicide layer 112 will simultaneously be formed at process 318 on the top surface of the gate structure 150. However, if the nitride cap layer 113 remains intact on the gate structure 150 after process 316, as shown in FIG. 9B, then the nitride cap layer 113 will block silicide formation on the gate structure 150 at process 318, as shown in FIG. 10B.

Additional processing can then be performed in order to complete the FET structure (320, see Figures 1A and 1B)). This additional processing can include, but is not limited to, the deposition of one or more additional dielectric layers 106 (i.e., one or more interlayer dielectrics) and the formation of contacts 165 through the additional dielectric layer(s) 106 to the gate structure (not shown) and to the metal silicide layer 111 above the second section 141 of each deep source/drain region 140.

Figure 11:
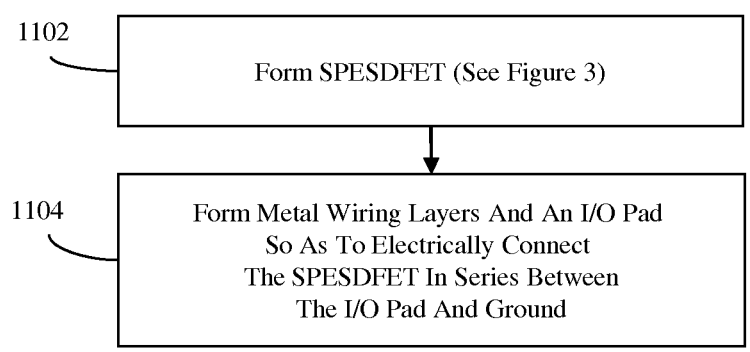
FIG. 11 is a flow diagram illustrating method embodiments for forming the integrated circuit of FIG. 2.

Referring to FIG. 11, also disclosed are embodiments of a method of forming an integrated circuit, such as the integrated circuit 200 described in detail above and illustrated in FIG. 2. Specifically, an N-type SPESDFET 100 can be formed, in the manner described above and illustrated in FIG. 3 (1104). Then, following contact 165 formation at process 320 of FIG. 3, the metal wiring levels and an input/output (I/O) pad can be formed such that the N-type SPESDFET 100 is electrically connected in-series between the input/output (I/O) pad 210 and ground 220 (1104, see FIG. 2). That is, the source/drain contacts 165 (i.e., the resistors, as illustrated) can be arranged between the SPESDFET 100 and the I/O pad 210 and between the SPESDFET 100 and ground 220, respectively. During this process 1104, the gate structure 150 can further be tied to an internal driver circuit output of the integrated circuit. As a result, the SPESDFET 100 can function as an input/output (I/O) pad driver and, since it is self-protected (i.e., robust against ESD damage), additional structures are not required for ESD protection.

The method embodiments as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Therefore, disclosed above are embodiments of a self-protected electrostatic discharge field effect transistor (SPESDFET). In the SPESDFET embodiments, a resistance region is positioned laterally between two discrete sections of a deep source/drain region: a first section that is adjacent to the channel region and a second section that is contacted. The second section of the deep source/drain region is silicided, but the first section adjacent to the channel region and the resistance region are non-silicided. Additionally, the gate structure can be either silicided or non-silicided. With such a configuration, the disclosed SPESDFET provides robust ESD protection without consuming additional area and without altering the basic FET design (e.g., without increasing the distance between the deep source/drain regions and the channel region). Also disclosed are embodiments of integrated circuit that incorporates the SPESDFET as an input/output (I/O) pad driver and method embodiments for forming the SPESDFET and the integrated circuit.

What is claimed is:

1. A field effect transistor comprising:
   a semiconductor layer having a top surface;
   an isolation structure in said semiconductor layer at said top surface;
   a gate structure on said top surface offset from said isolation structure, said gate structure having gate sidewalls;
   sidewall spacers on said top surface positioned laterally immediately adjacent to said gate sidewalls, said semiconductor layer comprising:
     a channel region below said gate structure;
     source/drain extension regions on opposing sides of said channel region, each source/drain extension region extending vertically from said top surface to a first depth below said top surface and comprising a first end portion adjacent to said channel region, a second end portion adjacent to said isolation structure and a center portion positioned laterally between said first end portion and said second end portion; and
     source/drain regions on said opposing sides of said channel region, each source/drain region comprising:
       a first section extending vertically through said first end portion of a source/drain extension region to a second depth below said first depth; and
       a second section extending vertically through said second end portion of said source/drain extension region to said second depth;
   first dielectric layers on said top surface aligned above and abutting said center portion of each of said source/drain extension regions, respectively;
   second dielectric layers above and abutting said first dielectric layers, respectively, each second dielectric layer extending laterally onto said top surface above said first section of a source/drain region to an outer edge of a sidewall spacer adjacent to said gate structure, and further extending laterally onto said top surface above said second section of said source/drain region; and
   metal silicide layers on said top surface above said second section of each of said source/drain regions, each metal silicide layer being positioned laterally immediately adjacent to a second dielectric layer.

2. The field effect transistor of claim 1, further comprising an additional metal silicide layer on said gate structure.

3. The field effect transistor of claim 1, said sidewall spacers being on said top surface above said first end portion of each of said source/drain extension and interfaces between said first section of each of said source/drain regions and said channel region being aligned below outer edges of said sidewall spacers.

4. The field effect transistor of claim 1, said first dielectric layers comprising first nitride layers and said second dielectric layers comprising second nitride layers.

5. The field effect transistor of claim 1, further comprising:
   at least one interlayer dielectric covering said metal silicide layer, said second dielectric layers, said sidewall spacers and said gate structure; and
   contact extending vertically through said interlayer dielectric to said metal silicide layers.

6. An integrated circuit comprising:
   an input/output (I/O) pad; and
   an input/output (I/O) pad driver connected in series between said input/output (I/O) pad and ground, said input/output (I/O) pad driver comprising a single N-type self-protected electrostatic discharge field effect transistor comprising:
     a semiconductor layer having a top surface;
     an isolation structure in said semiconductor layer at said top surface;
     a gate structure on said top surface offset from said isolation structure, said gate structure having gate sidewall;
     sidewall spacers on said top surface positioned laterally immediately adjacent to said gate sidewalls, said semiconductor layer comprising:
       a channel region below said gate structure;
       source/drain extension regions on opposing sides of said channel region, each source/drain extension region extending vertically from said top surface to a first depth below said top surface and comprising a first end portion adjacent to said channel region, a second end portion adjacent to said isolation structure and a center portion positioned laterally between said first end portion and said second end portion; and
       source/drain regions on said opposing sides of said channel region, each source/drain region comprising:
         a first section extending vertically through said first end portion of a source/drain extension region to a second depth below said first depth; and
         a second section extending vertically through said second end portion of said source/drain extension region to said second depth;
     first dielectric layers on said top surface aligned above and abutting said center portion of each of said source/drain extension regions, respectively;

second dielectric layers above and abutting said first dielectric layers, respectively, each second dielectric layer extending laterally onto said top surface above said first section of a source/drain region to an outer edge of a sidewall spacer adjacent to said gate structure, and further extending laterally onto said top surface above said second section of said source/drain region; and metal silicide layers on said top surface above said second section of each of said source/drain regions and positioned laterally immediately adjacent to a second dielectric layer.

7. The integrated circuit of claim 6, said field effect transistor further comprising an additional metal silicide layer on said gate structure.

8. The integrated circuit of claim 6, said sidewall spacers being on said top surface above said first end portion of each of said source/drain extension regions and interfaces between said first section of each of said source/drain regions and said channel region being aligned below outer edges of said sidewall spacers.

9. The integrated circuit of claim 6, said first dielectric layers comprising first nitride layers and said second dielectric layers comprising second nitride layers.

10. The integrated circuit of claim 6, further comprising:
at least one interlayer dielectric covering said metal silicide layers, said second dielectric layers, said sidewall spacers and said gate structure; and
a contact extending vertically through said interlayer dielectric to said metal silicide layers.

* * * * *